(12) United States Patent
Tsukagoshi

(10) Patent No.: US 7,821,025 B2
(45) Date of Patent: Oct. 26, 2010

(54) SEMICONDUCTOR LIGHT EMITTING UNIT, METHOD FOR MANUFACTURING SAME AND LINEAR LIGHT SOURCE

(75) Inventor: Kohji Tsukagoshi, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 817 days.

(21) Appl. No.: 11/657,681

(22) Filed: Jan. 23, 2007

(65) Prior Publication Data

US 2007/0170416 A1     Jul. 26, 2007

(30) Foreign Application Priority Data

Jan. 24, 2006 (JP) .............................. 2006-014992

(51) Int. Cl.
*H01L 27/15* (2006.01)
*H01L 29/22* (2006.01)

(52) U.S. Cl. ............................ 257/99; 257/13; 257/79; 257/98; 257/100

(58) Field of Classification Search .................. 257/13, 257/79, 98–100
See application file for complete search history.

(56) References Cited

U.S. PATENT DOCUMENTS 6,170,963 B1 * 1/2001 Arnold ....................... 362/246
7,579,629 B2 * 8/2009 Inoguchi ...................... 257/98
2005/0236638 A1 10/2005 Tsukagoshi

FOREIGN PATENT DOCUMENTS

JP        2000091646        3/2000

* cited by examiner

*Primary Examiner*—Kenneth A Parker
*Assistant Examiner*—Joseph Nguyen
(74) *Attorney, Agent, or Firm*—Bachman & LaPointe, P.C.

(57) ABSTRACT

A semiconductor light emitting unit is provided which comprises: a support 1 formed with longitudinal side walls 15 disposed opposite to each other for forming a pair of light reflective surfaces 9, and a bottom wall 16 connected to longitudinal side walls 15 for forming a mount surface 3a between light reflective surfaces 9 to form a channel 3 by longitudinal side walls 15 and bottom wall 16 above mount surface 3a. Formed at either end of channel 3 in the longitudinal direction of support 1 is a vertical opening 18 which serves to directly communicate channels 3 of adjacent light emitting units when plural semiconductor light emitting units are lengthwise arranged, so that there is no lateral side wall 15 obstructing path of light radiated from LED chips 2 toward outside to thereby irradiate uniform light to outside along the longitudinal direction of linear light source.

10 Claims, 7 Drawing Sheets

SEMICONDUCTOR LIGHT EMITTING UNIT, METHOD FOR MANUFACTURING SAME AND LINEAR LIGHT SOURCE

TECHNICAL FIELD

This invention relates to a semiconductor light emitting unit having a reflector, a method for manufacturing the same and a linear light source formed by combining a plurality of semiconductor light emitting units in the longitudinal direction.

BACKGROUND OF THE INVENTION

A semiconductor light emitting device 51 shown in FIG. 15, comprises a support 1, LED chips 2 as semiconducting light emitting elements secured on support 1, and a light transmitting protective resin 5 for encapsulating LED chips 2. The light emitting device 51 of this kind is known by U.S. patent application published under 2005/0236638 presented by the same inventor of this patent application and published Oct. 27, 2005. Support 1 comprises four side walls 35 for forming light reflecting surfaces 9, a bottom wall 36 connected to side walls 35 for a mount surface 33a between light reflecting surfaces 9, and a channel 33 surrounded by light reflecting surfaces 9 above bottom wall 36 to form a horizontal opening 37 at the top of channel 33. LED chips 2 are secured on mount surface 33a of support 1 and surrounded by side walls 35 of support 1. Each light reflecting surface 9 defined by longitudinal side walls 35 has an upwardly divergent ramp of light reflectivity for improvement in directivity and front brightness of light from LED chips 2.

For example, a back light of display in cellular phone, etc., employs a linear light source which comprises a plurality of semiconductor light emitting units connected in line to each other. FIG. 16 demonstrates a linear light source 61 having a plurality of semiconductor light emitting units or devices 51 longitudinally coupled to each other. Each semiconductor light emitting device 51 has eight LED chips 2 longitudinally arranged in line. Linear light source 61 shown in FIG. 16 can change the number of semiconductor light emitting devices 51 to be coupled to easily vary the length of linear light source 61 for different light source dimension in response to the requirement to size alteration in necessary display.

However, linear light source 61 of FIG. 16 is defective because its brightness is rather low in each join portion 21 connecting between semiconductor light emitting devices 51 due to insufficient amount of light from LED chips 2 even though light 20 is irradiated outside from LED chips 2 through horizontal opening 37 of support 1. Specifically, lateral side or end walls 35 of adjacent semiconductor light emitting device 51 obstruct path of light 20 emitted from LED chips 2 to outside in the lengthwise apposed construction of plural semiconductor light emitting devices 51. In this way, linear light source 61 of plural semiconductor light emitting devices 51 cannot uniformly release light along the longitudinal direction of light source 61.

Meanwhile, Japanese Patent Disclosure No. 2000-91646 published Mar. 31, 2000 represents a semiconductor light emitting device which comprises a support, a plurality of LED chips mounted on support in line, and light-reflectors attached around LED chips near both ends of support to increase amount of released light. This semiconductor light emitting device was considered to be able to repress brightness deterioration at the join portion between both ends of each semiconductor light emitting device by increase in front brightness of light irradiated from LED chips to outside.

Nevertheless, reflective structure shown in the latter Japanese reference cannot be applied to the reflective structure of the device 51 shown in FIG. 15 due to the difference in structure because the latter Japanese reference shows reflectors attached only to LED chips around both ends of support, whereas FIG. 15 displays a side wall 35 throughout the entire periphery of support 1. Also, even the semiconductor light emitting device of the latter reference cannot satisfactorily improve brightness deterioration between LED chips. Accordingly, it is unrealistic to utilize the light emitting structure shown in the latter reference to adjust brightness of light from LED chips near both ends of support for accomplishment of uniformly irradiated light along the longitudinal direction of linear light source.

Therefore, an object of the present invention is to provide a semiconductor light emitting unit which can assemble, by combination of plural light emitting units, a linear light source capable of producing lengthwise uniform light, method for manufacturing the same and linear light source.

SUMMARY OF THE INVENTION

The semiconductor light emitting unit according to the present invention, comprises: a support (1) formed with side walls (15) disposed opposite to each other for forming a pair of light reflective surfaces (9), and a bottom wall (16) connected to side walls (15) for forming a mount surface (3a) between light reflective surfaces (9) to form a channel (3) by side walls (15) and bottom wall (16) above mount surface (3a), and semiconducting light emitters (2) secured on mount surface (3a) of support (1). Channel (3) has a vertical opening (18) formed at either end of channel (3) in the longitudinal direction of support (1). Vertical opening (18) formed at either end of channel (3) serves to directly communicate channels (3) of adjacent light emitting units longitudinally apposed in line without any side wall so that light emitting units can form a linear light source capable of producing lengthwise uniform light. When a light transmitting protective resin (5) is filled in channel (3) to encapsulate semiconducting light emitters (2), and plural semiconductor light emitting units are lengthwise arranged, opposite end surfaces of protective resins (5) in adjacent light emitting units face-to-face contact to each other through respective vertical openings (18) at ends (3b) of channels (3) so that there is no lateral side wall (15) obstructing path of light radiated from semiconducting light emitters (2) toward outside. Consequently, in addition to light irradiated from light emitting elements (2) through horizontal opening (17) of channels (3), the light emitting unit can shad light through vertical openings (18) at ends (3b) of channels (3) to thereby irradiate uniform light to outside along the longitudinal direction of linear light source assembled by plural semiconductor light emitting units, advantageously preventing brightness degradation at the join portion between semiconductor light emitting units. Specifically, semiconducting light emitters (2) on one support (1) emit light which goes straight from protective resin (5) in channel (3) through vertical opening (18) into adjacent protective resin (5) in channel (3) of the other neighboring light emitting unit toward outside, and vice versa. In detail, light irradiated from semiconducting light emitting elements (2) on the other neighboring support (1) goes directly through channel (3) or protective resin (5) in channel (3) in one support (1) to outside. In this case, linear light source can be made into a desired length by changing the number or length of apposed semiconductor light emitting units to irradiate light from an intended span of elongated light source. Also, linear light source may be made for a desirable length by spacing semiconductor light emitting units in a line with a gap therebetween.

BRIEF DESCRIPTION OF THE DRAWINGS

The above-mentioned and other objects and advantages of the present invention will be apparent from the following description in connection with preferred embodiments shown in the accompanying drawings wherein:

FIG. 3 is a side elevation view of the linear light source turned on;

FIG. 17 is a side elevation view indicating the linear light source of FIG. 16 turned on.

BEST MODE FOR CARRYING OUT THE INVENTION

Figure 15:
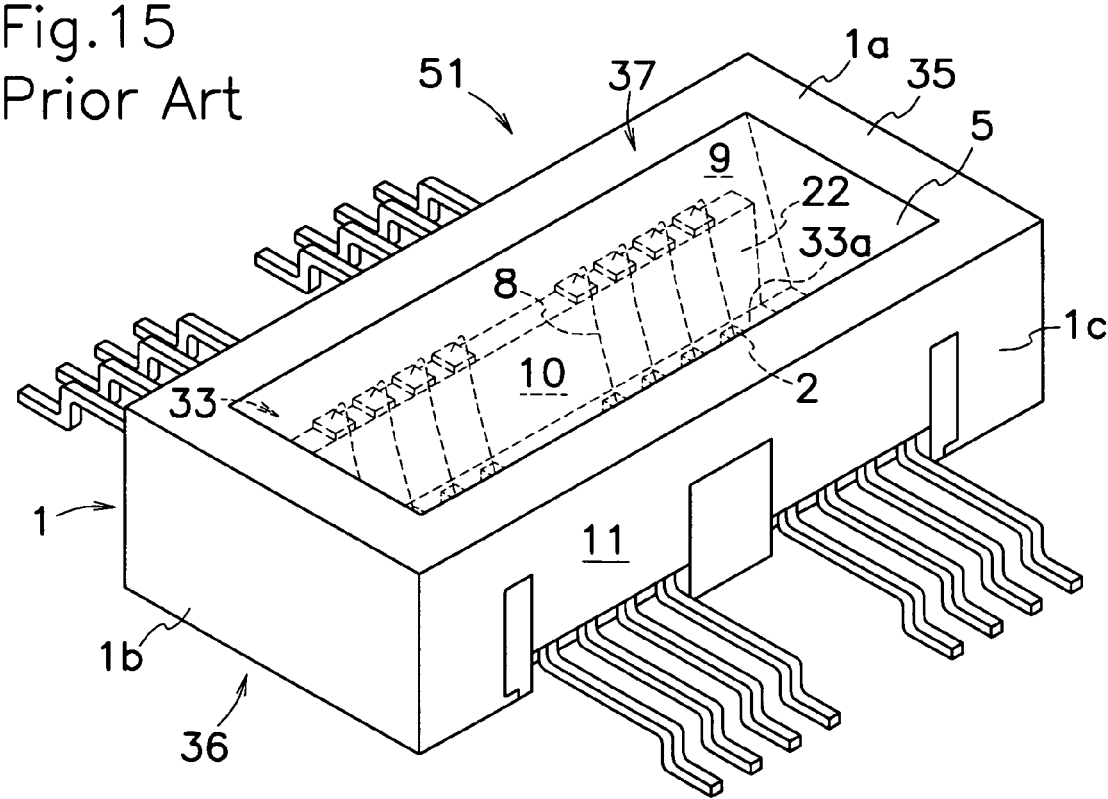
FIG. 15 is a perspective view of a prior art semiconductor light emitting device.
Figure 16:
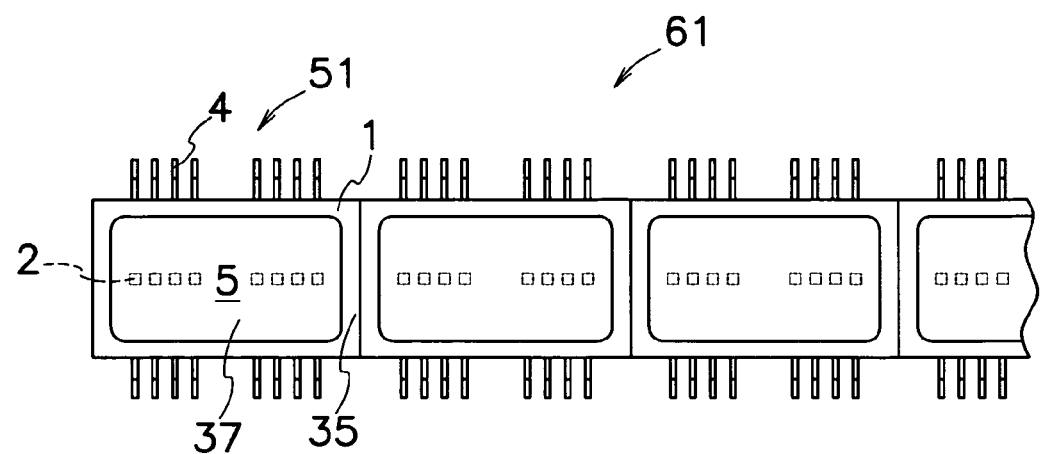
FIG. 16 is a plan view of a linear light source assembled by joining a plurality of the semiconductor light emitting device shown in FIG. 15 in a line.
Figure 17:
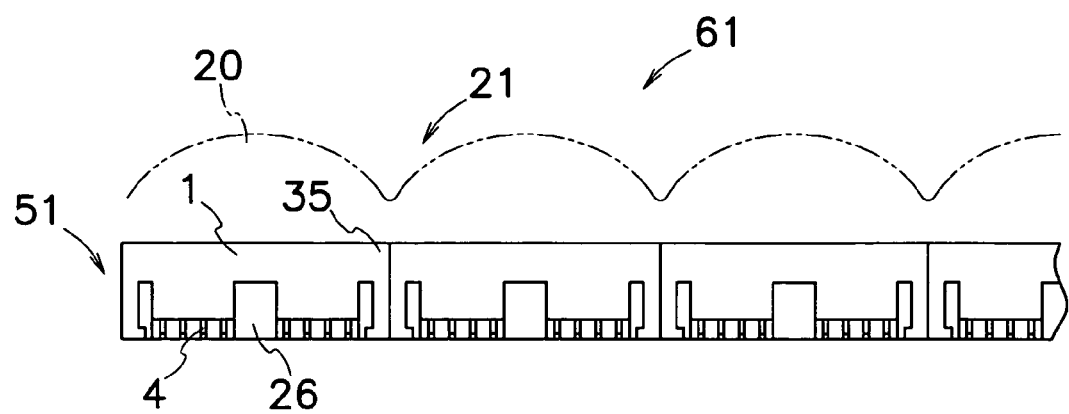

Embodiments of the semiconductor light emitting unit, method for manufacturing the same and linear light source according to the present invention will be described hereinafter in connection with FIGS. 1 to 14 of the drawings. Same reference symbols as those shown in FIGS. 15 to 17 are applied to similar components in FIGS. 1 to 14, omitting explanation thereon.

Figure 1:
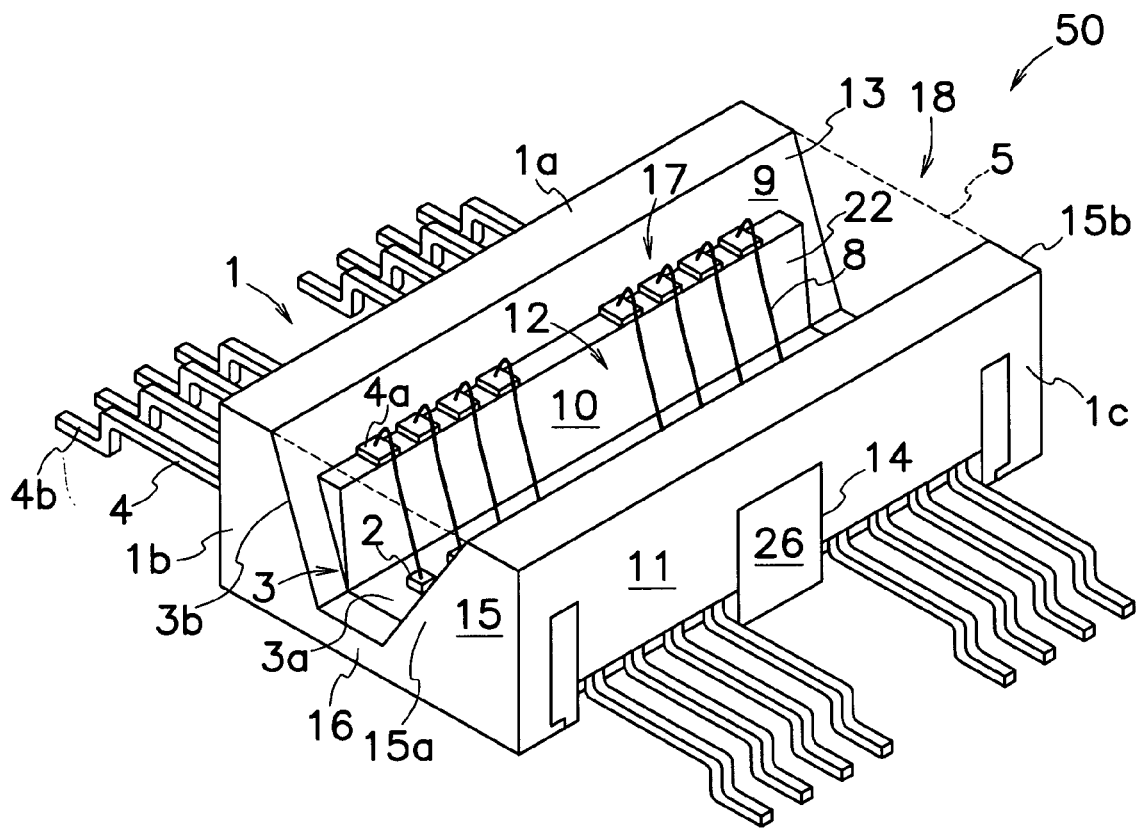
FIG. 1 is a perspective view indicating an embodiment of the semiconductor light emitting unit according to the present invention.

As shown in FIG. 1, the semiconductor light emitting unit (hereinafter referred to as "SLE unit") 50 of a first embodiment according to the present invention, comprises: a support 1, eight semiconducting light emitters or emitting elements (hereinafter referred to as "LED chips") 2 each secured on support 1, and a light transmitting protective resin 5 for encapsulating LED chips 2. Support 1 comprises longitudinal side walls 15 formed opposite to each other with a pair of light reflective surfaces 9, and a bottom wall 16 integrally formed with side walls 15 for providing a mount surface 3a between light reflective surfaces 9 and a channel 3 in cooperation with side walls 15 and bottom wall 16 above mount surface 3a. LED chips 2 are secured on mount surface 3a of support 1, and protective resin 5 is filled in channel 3 for sealing LED chips 2. Channel 3 has a horizontal opening 17 formed at the top thereof to open channel 3 upward to outside, and vertical openings 18 formed into generally an inverted trapezoid at both ends of channel 3 in the longitudinal direction of support 1 to open channel 3 horizontally and longitudinally to outside. Vertical openings 18 are formed in an imaginary vertical plane and defined between longitudinal side walls 15 above bottom wall 16 so that protective resin 5 longitudinally extends and has opposite ends terminating at the imaginary vertical plane of vertical openings 18. The shown arrangement is characterized by providing a pair of vertical openings 18 at both ends of channel 3 unlike the prior art structure shown in FIG. 15.

Also, support 1 comprises a heat sink or radiator 10 formed with a depression 12 on an upper surface 10a thereof, and a plastic encapsulant 11 for hermetically closing upper surface 10a, longitudinal outer surfaces 10b and a portion of transverse or lateral outer surfaces 10c of radiator 10 except depression 12 for forming inner ramps 22. Plastic encapsulant 11 has inclined surfaces 13 for upwardly extending inner ramps 22 to form channel 3 of support 1 in cooperation of mount surface 3a, depression 12 and inclined surfaces 13. Accordingly, a bottom surface of depression 12 provides mount surface 3a on which LED chips 2 are firmly attached to electrically connect a bottom electrode (not shown) of each LED chip 2 and radiator 10. A pair of inner ramps 22 are formed in a laterally spaced relation to and opposite to each other, and inclined surfaces 13 of plastic encapsulant 11 are formed at an oblique angle lower than that of inner ramps 22 of radiator 10 with upwardly augmenting or triangular step so that each inclined surface 13 provides an essential extension of mating inner ramp 22. As illustrated, depression 12 has vertical openings at the opposite ends of radiator 10 to open depression 12 horizontally and longitudinally to outside in alignment with mating vertical openings 18 of plastic encapsulant 11. Radiator 10 is formed of a metallic material of high thermal conductivity such as copper, aluminum or alloy thereof, and plastic encapsulant 11 is formed of opaque or translucent resin of high softening point and having the relatively high content of additive compound or filler such as silica.

Figure 5:
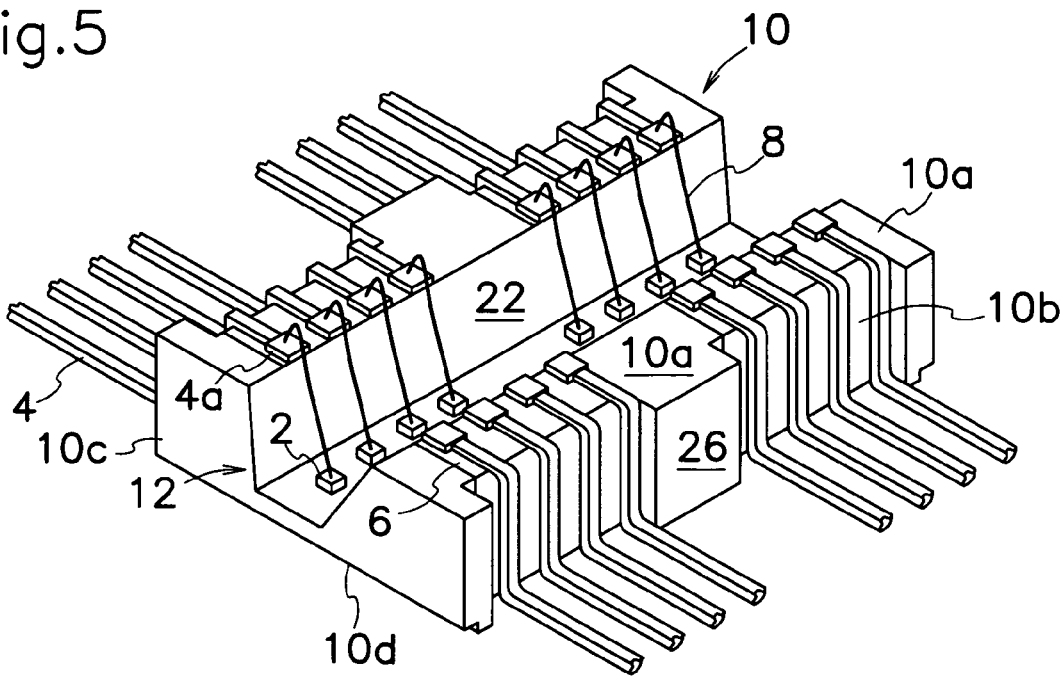
FIG. 5 is a perspective view showing LED chips and wiring conductors mounted on the heat sink.
Figure 6:
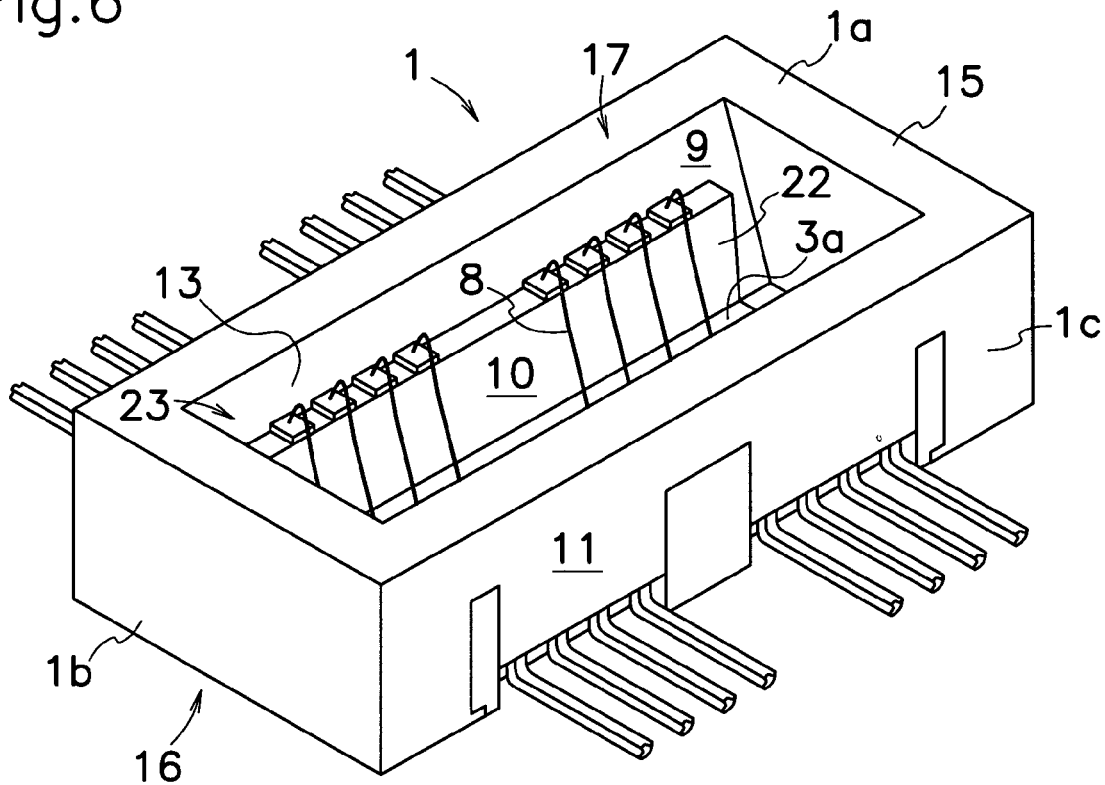
FIG. 6 is a perspective view indicating a plastic encapsulant formed on the heat sink shown in FIG. 5.
Figure 7:
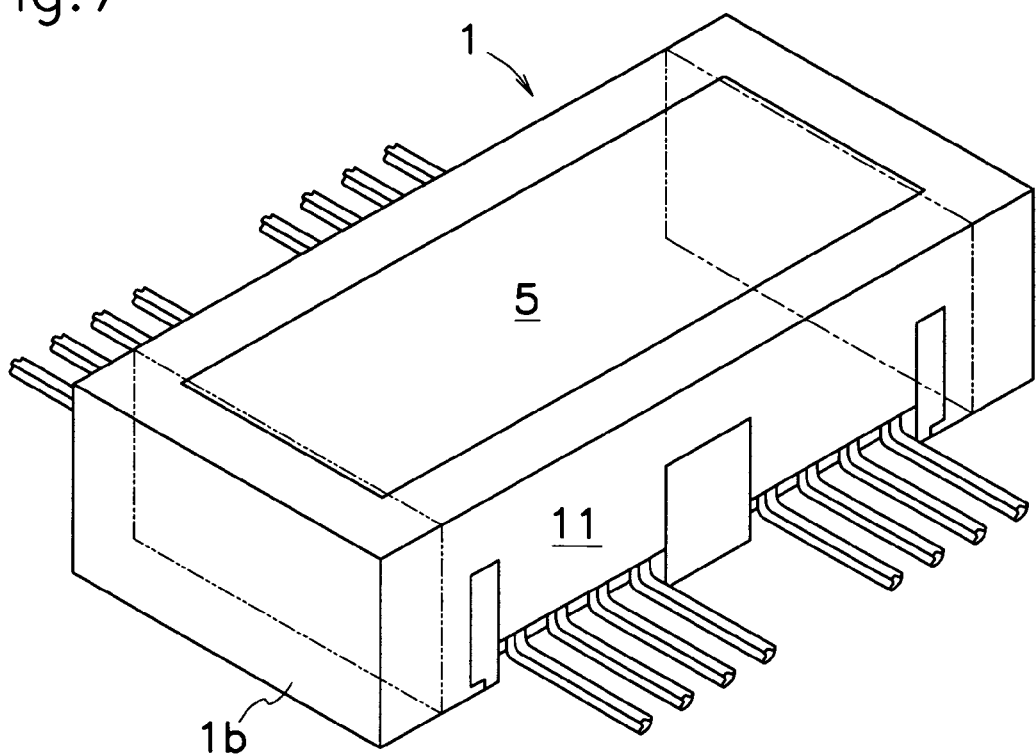
FIG. 7 is a perspective view indicating opposite ends of the plastic encapsulant shown in FIG. 6 to be cut out.

Referring now to FIG. 5, sixteen wiring conductors 4 extend along each upper surface 10a and each longitudinal side wall 10b of radiator 10, and then, project outwardly at the bottom of longitudinal side wall 10b. Each wiring conductor 4 has an inner end 4a electrically connected to a top electrode (not shown) of corresponding LED chip 2 and an outer end 4b led out of plastic encapsulant 11. Each inner end 4a of wiring conductor 4 is disposed on upper surface 10a of radiator 10 through an electric insulator 6, and connected to top electrode of corresponding LED chip 2 by means of lead wire or bonding wire 8. Plastic encapsulant 11 covers upper surfaces 10a and longitudinal side surfaces of side walls 10b in radiator 10 and intermediate portion of each wiring conductor 4. A bottom surface 10d of radiator 10 is exposed to outside of plastic encapsulant 11. Protective resin 5 such as transparent and thermally resistant silicone resin is filled in channel 3.

As shown in FIG. 1, radiator 10 is formed with lugs 26 each outwardly extending from each of longitudinal side walls 10b to be exposed to outside through a notch 14 formed in plastic encapsulant 11. When a large amount of electric current is sent through wiring conductor 4, LED chips 2 and radiator 10 to turn LED chips 2 on with the high brightness, a sufficient amount of heat generated from LED chips 2 can be released to outside through lugs 26 of longitudinal side walls 10b in addition to heat radiation through bottom surface 10d of radiator 10 to outside. In this arrangement, bottom surface 10d of radiator 10 and each outer end of wiring conductors 4 can be secured on metallic pads or through-holes on circuit board to attach thereon a horizontally surface-mounted SLE unit 50 capable of vertically upwardly irradiating light from LED chips 2. Alternatively, any lug 26 and each outer end of wiring conductors 4 can be secured on metallic pads or through-holes on circuit board to vertically attach thereon a vertically surface-mounted SLE unit 50 capable of horizontally irradiating light from LED chips 2 in parallel to circuit board.

Figure 2:
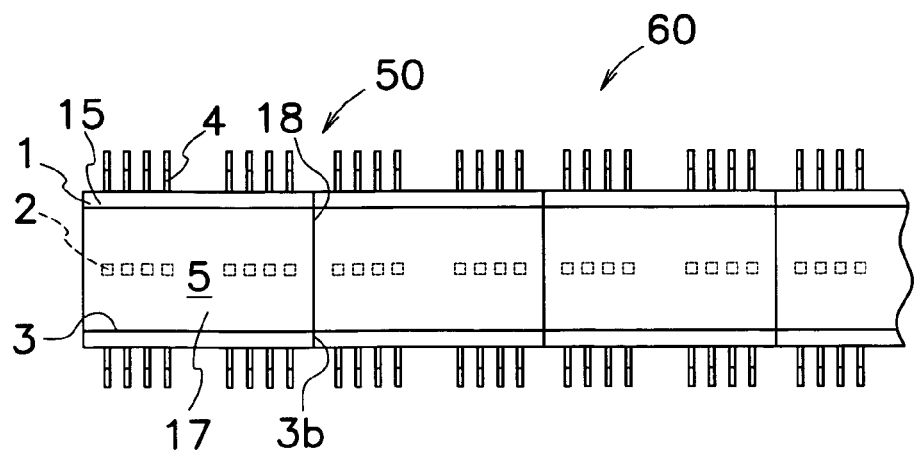
FIG. 2 is a partial plan view of a linear light source formed by incorporating in a line a plurality of the semiconductor light emitting units shown in FIG. 1.
Figure 3:
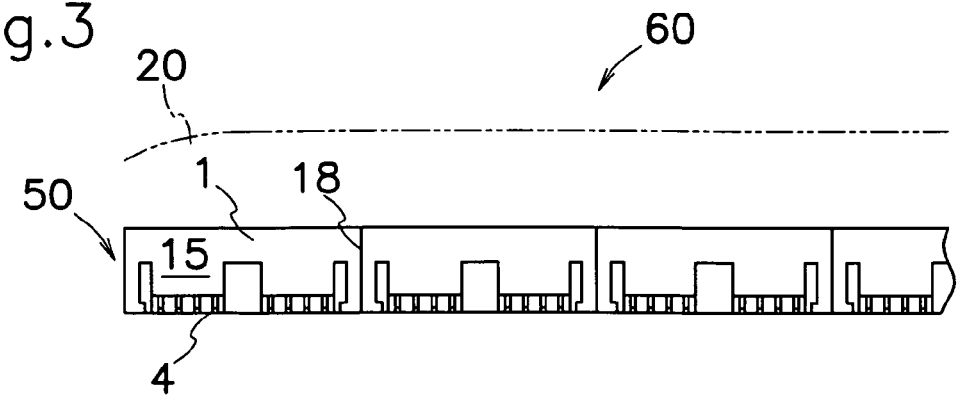

FIG. 2 illustrates a linear light source 60 formed by lengthwise arranging a plurality of SLE units 50 in a line by joining lateral side walls 15 and vertical openings 18 of adjoining SLE units 50. This arrangement makes bottom wall 16, mount surface 3a of channel 3, inclined surfaces 13 of plastic encapsulant 11 and inner ramps 22 of radiator 10 of longitudinally arranged neighboring SLE units 50 flush with each other, when contacting adjacent lateral side walls 15 and vertical openings 18 each other, and lateral end surfaces of protective resins 5 between SLE units 50 face each other to optically communicate adjacent protective resins 5 of SLE units 50 through vertical openings 18 so that light emitted from LED chips 2 can be released from adjacent protective resin 5 to outside through vertical openings 18 without obstruction by lateral side walls. Also, light emitted from each LED chip 2 is irradiated from horizontal opening 17 of support 1 to outside directly through protective resin 5 in channel 3 or after reflected on inner ramps 22 of radiator 10 or inclined surfaces 13 of plastic encapsulant 11. A part of light emitted from LED chips 2 goes straight into protective resin 5 of neighboring SLE unit 50 through vertical opening 18 and then is radiated from horizontal opening 17 of adjacent SLE unit 50. Accordingly, the embodiment can accomplish a generally uniformly irradiated light 20 from LED chips 2 from horizontal openings 17 along the longitudinal direction of linear light source 60 of combined SLE units 50 by transmission of light through ends 3b of channels 3 and vertical openings 18 between adjoining protective resins 5, thereby preventing or inhibiting a deterioration in brightness of light between SLE units 50.

Linear light source 60 can be horizontally mounted on circuit board by securing bottom surface 10d of each radiator 10 of unit 50 on circuit board with solder or brazing metal in addition to or without bonding of wiring conductors 4 on circuit board to irradiate vertical uniform light from linear light source 60 relative to circuit board. Alternatively, linear light source 60 can be vertically mounted on circuit board by securing lug 26 of radiator 10 on circuit board with solder or brazing metal in addition to or without bonding of wiring conductors 4 on circuit board to irradiate horizontal uniform light from linear light source 60 relative to circuit board. In any event, each SLE unit 50 can be stably secured on circuit board to prevent deviation in directivity angle or uneven directivity angle of light from unit 50.

Linear light source 60 shown in FIG. 2 has two vertical openings 18 at the opposite longitudinal ends 3b of channel 3 so that linear light source 60 can have at least three or more SLE units 50 connected to each other through vertical openings 18 at both ends 3b of each channel 3. However, only one vertical opening 18 may be provided at either end 3b of channel 3. In short, linear light source 60 can be adjusted in length by changing the number of or gap between SLE units 50 to irradiate light from linear light source 60 of desired span or dimension.

Figure 4:
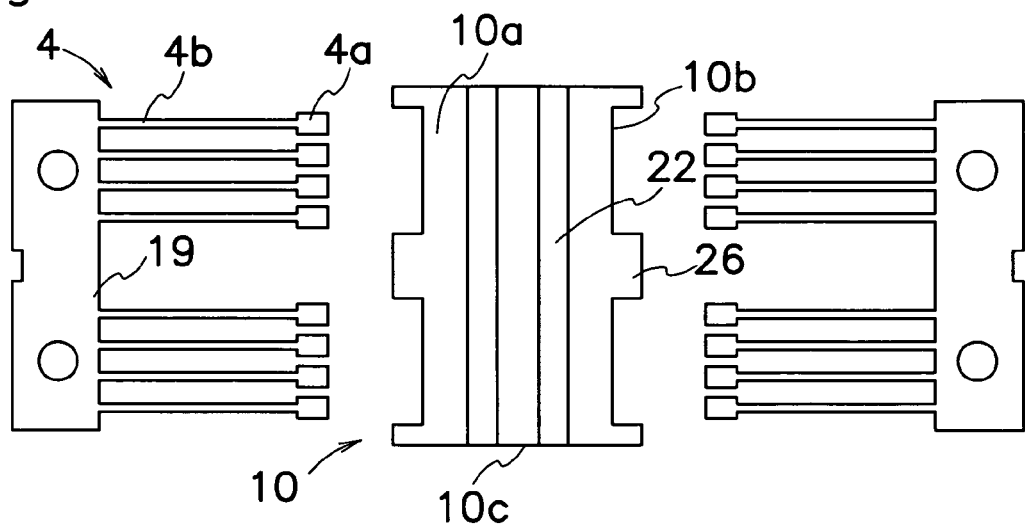
FIG. 4 is a plan view of a heat sink and wiring conductors.

In manufacturing the SLE unit 50 shown in FIG. 1, a metallic strip is formed by pressing into a plurality of radiators 10 and wiring conductors 4 each outer end of which is connected to a tie bar 19 depicted in FIG. 4. As illustrated in FIG. 5, for example, electrically insulating tapes or sheets 6 are attached on upper surfaces 10a and each outer vertical surface of longitudinal side walls 10b, and then, two-position-bent wiring conductors 4 with tie bar 19 are also attached on insulating tapes 6. Then, a well-known injection molding technique is used to mold plastic encapsulant 11 on radiator 10 to encapsulate upper and longitudinal side surfaces 10a and 10b of radiator 10 and each intermediate portion of wiring conductors 4. The foregoing processes provide support 1 formed with four side walls 15 and a bottom wall 16 integral with four side walls 15 to define groove 23, light reflecting surfaces 9 and horizontal opening 17 together with molded radiator 10 which has depression 12 and mount surface 3a flush with bottom wall 16. Before or after plastic encapsulant 11 is molded, LED chips 2 are mounted and bonded on mount surface 3a of radiator 10 through horizontal opening 17 by means of die bonder, and then, lead wires 8 are connected between each top electrode of LED chips 2 and each inner end 4a of wiring conductors 4 by a well-known wire bonding technique.

Subsequently, protective resin 5 is filled and retained in groove 23 shaped into a container enclosed by four side walls 15 and bottom wall 16 to seal LED chips 2 by protective resin 5. After curing of protective resin 5 in groove 23, both ends 1b of support 1, namely opposite lateral side walls 15 are cut out from support 1 as shown by dashed lines in FIG. 7 to form channel 3 and vertical openings 18 which make end surfaces of protective resin 5 directly exposed to outside. Finally, unnecessary parts such as tie bars 19 are removed from wiring conductors 4 to finish an SLE unit 50 shown in FIG. 1.

Figure 8:
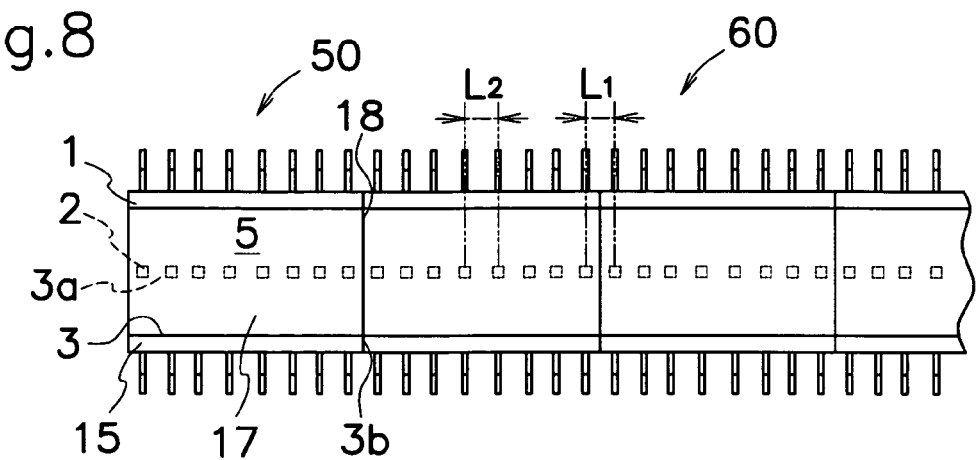
FIG. 8 is a partial plan view of the linear light source having LED chips mounted at constant intervals.
Figure 9:
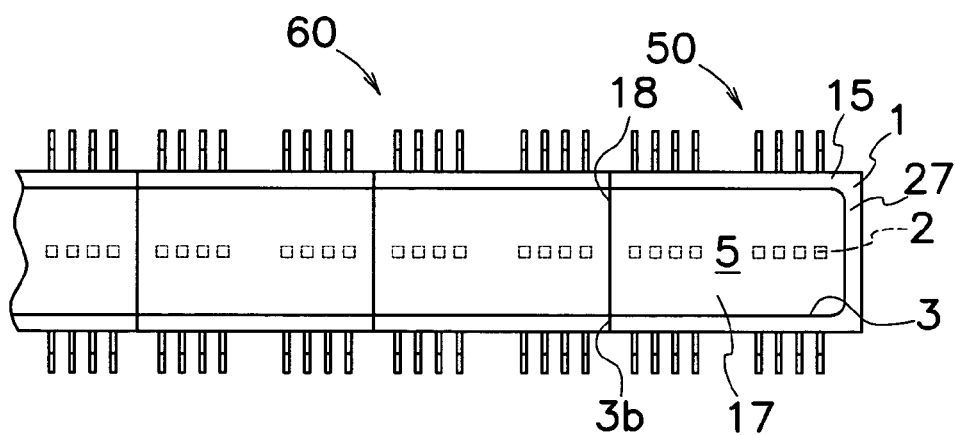
FIG. 9 is a partial plan view of the linear light source provided with a lateral side wall at one end of the linear light source.
Figure 10:
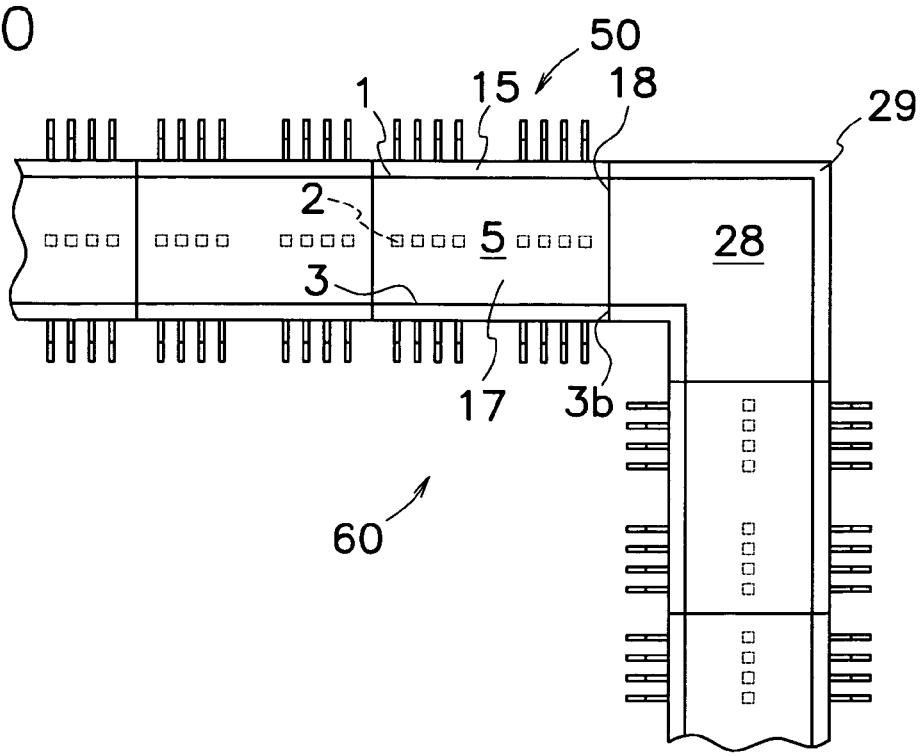
FIG. 10 is a partial plan view of the linear light source formed into an L-shape by means of an elbow connector.

Embodiments of the present invention can be modified in various modes without limitation to the above-mentioned embodiment. For instance, as shown in FIG. 8, a plurality of LED chips 2 may be mounted on mount surface 3a of support 1 at constant intervals to irradiate uniform light along the longitudinal direction from lined SLE units 50. Also, a spacing $L_1$ between two outer or distal LED chips 2 located at ends of neighboring units 50 may be equal or nearly equal to a spacing $L_2$ between two inner or medial LED chips 2 to produce more uniform light in the longitudinal direction of linear light source 60. As understood from FIG. 9, a lateral end side wall 27 may be provided at an end 15a of distal SLE unit 50 or at each outer end 15a of distal SLE units 50 to prevent optical diffusion at ends of linear light source 60 by lateral end side wall 27. As shown in FIG. 10, linear light source 60 may be formed into an L- or ditch-shape by means of an elbow connector or connectors 28 to connect vertical and horizontal SLE units 50. Connector 28 is formed into an L- or sector shape with side walls 29 positioned adjacent to and in alignment with longitudinal side walls 15 of SLE units 50 to prevent light diffusion at the corner of L-shaped linear light source 60. Not shown, but SLE unit formed into L- or sector shape may be arranged in lieu of connector 28.

Figure 11:
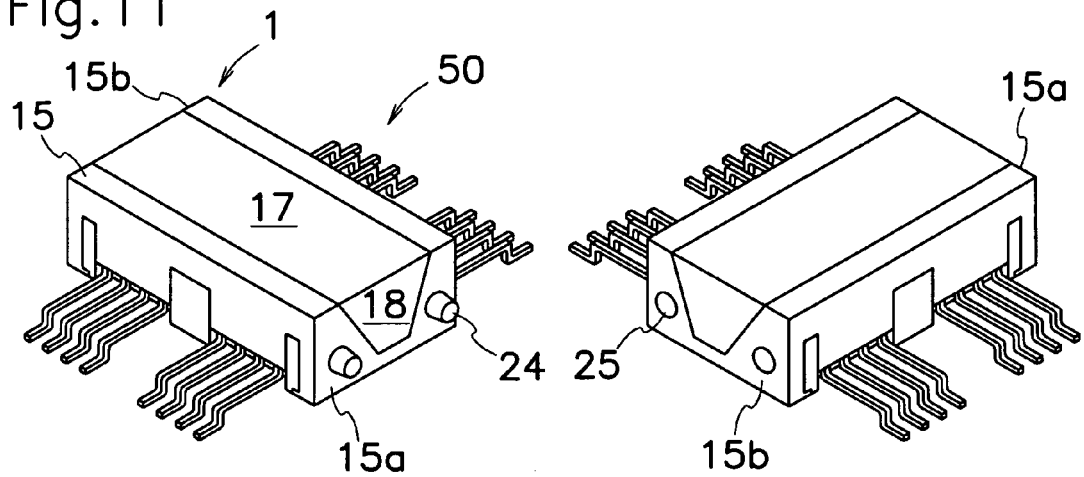
FIG. 11 is a perspective view of the semiconductor light emitting units provided with a joint structure on their end surfaces.
Figure 12:
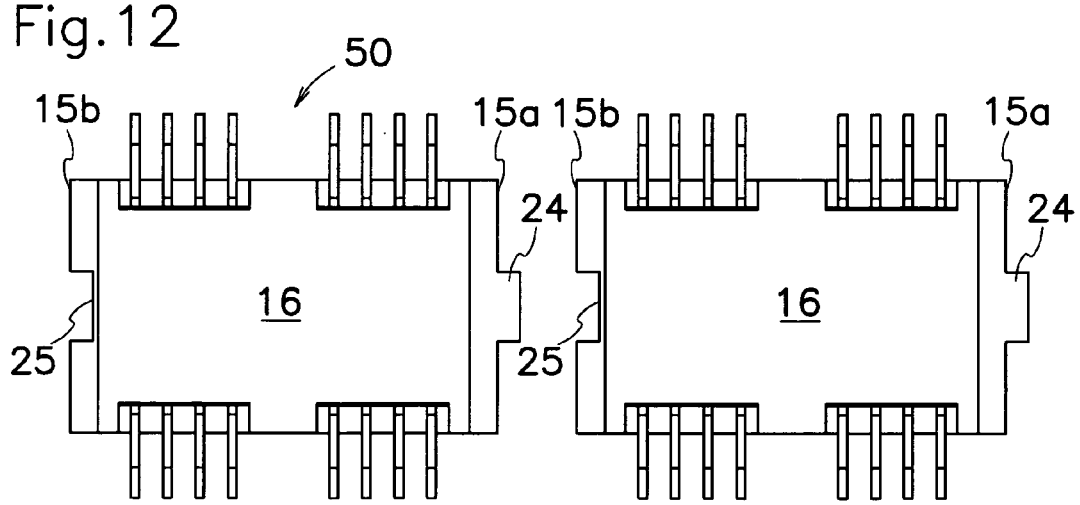
FIG. 12 is a bottom view of the semiconductor light emitting units provided with a tenon-mortice joint structure.
Figure 13:
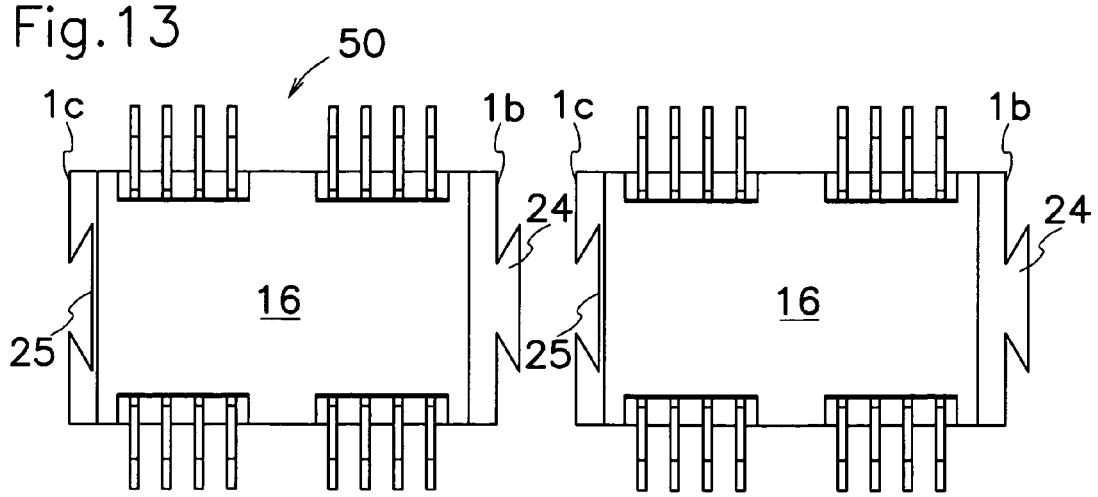
FIG. 13 is a bottom view of the semiconductor light emitting units provided with a dovetail joint structure.

As shown in FIG. 11, adjoining SLE units 50 may have on the lateral surfaces 15a thereof a coupling device which comprises join protrusions 24 and join cavities 25 both integrally formed with plastic encapsulant 11 to easily fit and pull out join protrusions 24 into and from join cavities 25 for easy connection and disconnection between SLE units 50. For example, SLE unit 50 may have join protrusions 24 on one lateral surface 15a and join cavities 25 on the other lateral surface 15a so that join cavities 25 and join protrusions 24 of neighboring SLE unit 25 can be engaged with the former join protrusions 24 and join cavities 25 for proper and foolproof connection between SLE units 50. This enables to couple SLE units 50 in exact alignment with each other without incorrect fitting. As shown in FIGS. 12 and 13, coupling device may have a tenon-mortice or a dovetail joint structure for simple or firm connection between SLE units 50.

Figure 14:
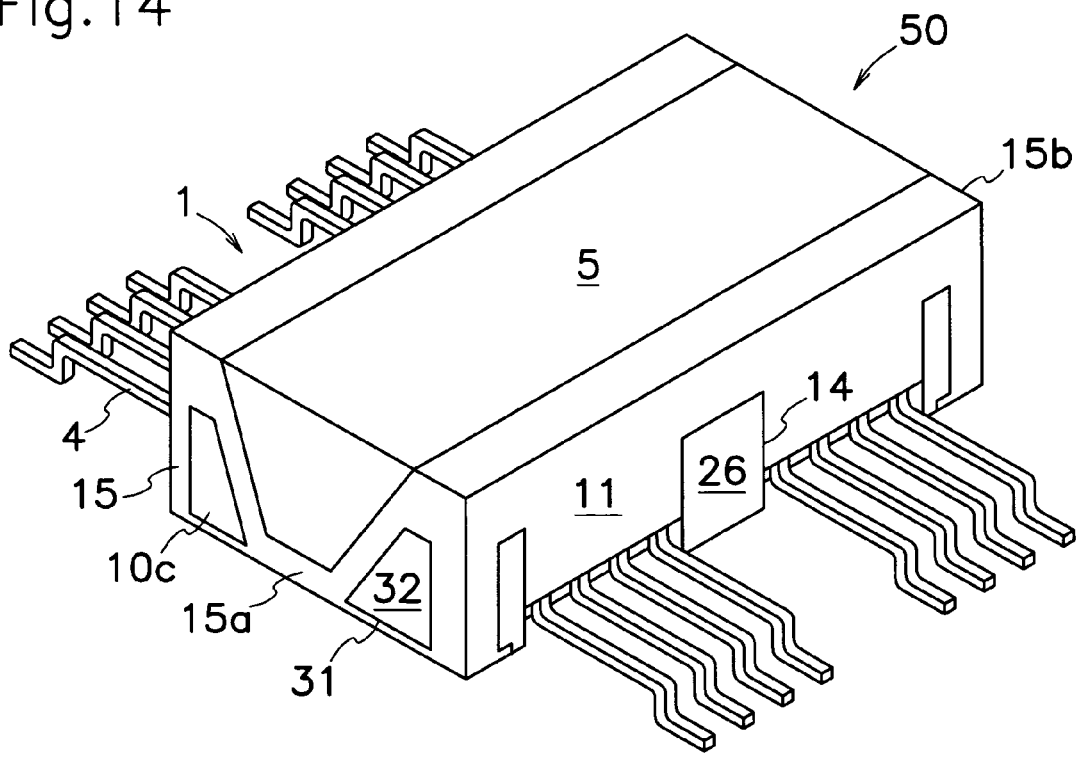
FIG. 14 is a perspective view of the semiconductor light emitting unit having side surfaces provided with a protrusion from the heat sink.

FIG. 14 represents an SLE unit 50 having ledges 32 extending outwardly from outer surfaces 10c of radiator 10 through notches 31 formed in plastic encapsulant 11 to expose end surfaces of ledges 32 directly to outside so that ledges 30 can also help dissipate heat transmitted to radiator 10 from LED chips 2 to outside or atmosphere in addition to heat radiation from bottom surface 10d and lugs 26 of radiator 10. In another mode, neighboring SLE units 50 can be joined each other by bonding facing end surfaces of ledges 32 with solder or blazing metal. In the linear light source 60, LED chips 2 of combined SLE units 50 can simultaneously be turned on by electrically connecting radiators 10 in these SLE units 50 through ledges 32.

In the foregoing embodiment, after vessel-shaped groove 23 is formed in support 1, both ends of groove 23 are cut out to form channel 3 housing protective resin 5, but alternatively, channel 3 may be formed without forming the groove 23 by rectangular side walls 15. In a further embodiment of the present invention, channel 3 may be empty without protective resin 5. Not shown, but radiators 10 are placed in cavities formed in upper and lower metallic molds while lateral outer surfaces 10c of radiators 10 are in close contact to corresponding inner surfaces for defining the cavity, and an injection molding technique is used to mold plastic encapsulants 11 firmly enveloping upper surfaces 10a and longitudinal outer surfaces 10b of radiator 10 and each intermediate portion of wiring conductors 4. This injection molding technique provides the support 1 having two side walls 15 and a bottom wall 16 connected to side walls 15 to make up channel 3 configured by light reflective surfaces 9, mount surface 3a between reflective surfaces 9 and horizontal opening 17. Before or after plastic encapsulant 11 is molded, LED chips 2 are mounted and bonded on mount surface 3a of radiator 10 and then lead wires 8 are connected between each top electrode of LED chips 2 and each inner end 4a of wiring conductors 4. Later, support 1 is put on a table, covering vertical openings 18 by shield plates movable on table, and light transmitting protective resin 5 is filled in channel 3 to enclose LED chips 2 with protective resin 5. After curing of protective resin 5, shield plates are removed to form support 1 with protective resin 5 lateral surfaces of which are exposed to outside through lateral openings 18. Thereafter, unnecessary parts are removed from wiring conductors 4 to finish SLE unit 50 shown in FIG. 1.

Shown SLE unit 50 has eight LED chips 2 and sixteen wiring conductors 4 on the opposite sides of each LED chip 2, however, these number and configuration may be varied as required or in terms of designs, and SLE unit 50 may have LED chips 2 generating a simple color light of blue, red or green or mixed color light or plural color lights thereof. Also, the linear light source 60 may be designed to irradiate preferably mixed color light emitted from LED chips 2 in neighboring SLE units 50. Fluorescent materials may be blended into protective resin 5 to convert wavelength of light emitted from LED chips 2 into another one. Each of LED chips 2 in SLE unit 50 may be individually turned on by separately sending electric current to each LED chip 2 through corresponding wiring conductors 4. To the contrary, a plurality of LED chips 2 may be turned on simultaneously or at a time through an integrally-formed wiring conductor 4. Illustrated SLE unit 50 has metallic radiator 10 embedded in plastic encapsulant 11, however, support 1 may be integrally formed of a metallic or plastic material. Basic structure of the semiconductor light emitting device applied to the exemplified SLE unit 50 in embodiments is known by U.S. Published Application under 2005/0236638 and should not limit the scope of the present invention.

Accordingly, the method for producing an SLE unit according to the present invention, comprises the steps of: forming a support 1 formed with side walls 15 disposed opposite to each other for forming a pair of light reflective surfaces 9, a bottom wall 16 connected to side walls 15 for forming a mount surface 3a between light reflective surfaces 9 to form a channel 3 above mount surface 3a by side walls 15 and bottom wall 16, and a vertical opening 18 formed at either end of channel 3 in the longitudinal direction of support 1; putting semiconducting light emitters or LED chips 2 on mount surface 3a of support 1 through a horizontal opening 17 of channel 3 and securing LED chips 2 on mount surface 3a, putting support 1 on a table while closing vertical opening 18, and filling channel 3 with a light transmitting protective resin 5 to encapsulate LED chips 2; and removing support 1 from the table after curing of protective resin 5.

Another method for producing an SLE unit according to the present invention, comprises the steps of: forming a support 1 formed with a side wall 15 for forming light reflective surfaces 9, and a bottom wall 16 connected to side wall 15 and having a mount surface 3a to form a groove 23 above mount surface 3a by side walls 15 and bottom wall 16, and a horizontal opening 17 formed at a top end of side wall 15; putting LED chips 2 on mount surface 3a of support 1 through horizontal opening 17 of channel 3 and securing LED chips 2 on mount surface 3a, filling channel 3 with a light transmitting protective resin 5 to encapsulate LED chips 2; and cutting at least one end of support 1 after curing of protective resin 5 to form a channel 3 with a vertical opening 18 at an end of channel 3 for exposing protective resin 5 to outside.

The linear light source according to the present invention, comprises: a plurality of SLE units 50 each of which comprises a support 1 formed with side walls 15 disposed opposite to each other for forming a pair of light reflective surfaces 9, a bottom wall 16 connected to side walls 15 for forming a mount surface 3a between light reflective surfaces 9, and a groove 17 formed above mount surface 3a by side walls 15 and bottom wall 16, LED chips 2 secured on mount surface 3a of support 1, and a light transmitting protective resin 5 filled in channel 3 for encapsulating LED chips 2. Channel 3 has a vertical opening 18 formed at either end of channel 3 in the longitudinal direction of support 1, and adjacent SLE units 50 are connected to each other by communication of their openings 18.

The present invention can provide a display device of high quality when a plurality of SLE units are assembled into a linear light source which serves as a back light capable of releasing longitudinally uniform light. The present invention is preferably applicable to linear light sources for use in backlights of display of any kind, LED display devices, illuminating devices or line sensors for printers, facsimile machines or scanners.

What is claimed are:

1. A semiconductor light emitting unit comprising:
   a support which comprises a radiator and a plastic encapsulant,
   said radiator comprising an upper surface, longitudinal outer surfaces, transverse outer surfaces and a depression formed on the upper surface to form inner ramps and a mount surface between said inner ramps, said plastic encapsulant hermetically closing the upper surface, longitudinal outer surfaces and a portion of the transverse outer surfaces of said radiator to form longitudinal side walls disposed opposite to each other, a pair of light reflective surfaces, a bottom wall connected to said side walls and a channel by said side walls and bottom wall above said mount surface, said channel being communicated with the depression of the radiator, semiconducting light emitters secured on said mount surface of said radiator, and a light transmitting protective resin filled in said depression of the radiator and said channel of the plastic encapsulant for encapsulating said semiconducting light emitters, wherein said channel has at least one vertical opening formed at either end of said channel in the longitudinal direction of said support, and at least one end surface of said protective resin in the longitudinal direction of said support is directly exposed to outside through said vertical opening.

2. The semiconductor light emitting unit of claim 1, wherein said vertical opening is formed in an imaginary vertical plane and defined between said side walls above said bottom wall, and said light transmitting protective resin has at least one end surface terminating at the imaginary vertical plane of said vertical opening.

3. The semiconductor light emitting unit of claim 1, wherein said channel has vertical openings formed at both ends of said channel in the longitudinal direction of said support, and end surfaces of said protective resin in the longitudinal direction of said support are directly exposed to outside through said vertical opening.

4. The semiconductor light emitting unit of claim 1, further comprising fluorescent materials blended into said protective resin to convert wavelength of light emitted from said semiconducting light emitters into another one.

5. The semiconductor light emitting unit of claim 1, wherein said protective resin is formed of a silicone resin filled in said depression of the radiator and said channel of the plastic encapsulant.

6. The semiconductor light emitting unit of claim 1, wherein said protective resin manufactured from a silicone resin by the process of:

forming said support having said channel with said vertical opening, putting said semiconducting light emitters on said mount surface of the radiator and securing said semiconducting light emitters on said mount surface, putting said support on a table while closing said vertical opening, filling said depression of the radiator and said channel of the plastic encapsulant with the silicone resin to encapsulate said semiconducting light emitters, and removing said support from said table after curing of the silicone resin.

7. The semiconductor light emitting unit of claim 1, wherein said protective resin manufactured from a silicone resin by the process of:

forming said support having a groove shaped into a container enclosed by four side walls and said bottom wall of the plastic encapsulant, putting said semiconducting light emitters on said mount surface of the radiator and securing said semiconducting light emitters on said mount surface, filling said depression of the radiator and said groove of the plastic encapsulant with the silicone resin to encapsulate said semiconducting light emitters, and cutting at least one end of the plastic encapsulant after curing of the silicone resin to form said channel with said vertical opening at either end of said channel for exposing said protective resin to outside.

8. The semiconductor light emitting unit of claim 1, wherein the end surfaces of said protective resins between the semiconductor light emitting units face each other to optically communicate adjacent said protective resins of the semiconductor light emitting units through said vertical openings, when lengthwise arranging a plurality of the semiconductor light emitting units in a line by joining said vertical openings of adjoining the semiconductor light emitting units.

9. The semiconductor light emitting unit of claim 8, further comprising a connector formed into an L- or sector shape with side walls positioned adjacent to and in alignment with said side walls of the semiconductor light emitting units to connect the semiconductor light emitting units each other.

10. The semiconductor light emitting unit of claim 1, wherein said radiator is formed with lugs each outwardly extending from each of longitudinal side walls of said radiator for exposure of the lugs to outside through a notch formed in said plastic encapsulant to release heat generated from said semiconducting light emitters to outside through said lugs.

\* \* \* \* \*